(12) United States Patent  (10) Patent No.: US 7,582,936 B2
Kim  (45) Date of Patent: Sep. 1, 2009

(54) ELECTRO-STATIC DISCHARGE PROTECTION CIRCUIT AND METHOD FOR FABRICATING THE SAME

(75) Inventor: Kil-Ho Kim, Chungcheongbuk-do (KR)

(73) Assignee: MagnaChip Semiconductor (KR)

( * ) Notice: Subject to any disclaimer, the term of this patent is extended or adjusted under 35 U.S.C. 154(b) by 368 days.

(21) Appl. No.: 11/319,573

(22) Filed: Dec. 29, 2005

(65) Prior Publication Data

US 2006/0145260 A1 Jul. 6, 2006

(30) Foreign Application Priority Data

Dec. 30, 2004 (KR) ............... 10-2004-0115911

(51) Int. Cl.
 *H01L 23/62* (2006.01)
 *H01L 21/336* (2006.01)
(52) U.S. Cl. ............... 257/355; 257/E29.024; 438/197
(58) Field of Classification Search ......... 257/213, 257/288, 355, 356, 357, 360, 361, 362, E29.024; 438/142, 197, 279
See application file for complete search history.

(56) References Cited

U.S. PATENT DOCUMENTS 6,690,069 B1 2/2004 Vashchenko et al. ........ 257/362

2002/0163009 A1 11/2002 Ker et al. ............... 257/107
2003/0016479 A1 1/2003 Song ....................... 361/156
2007/0241407 A1* 10/2007 Kim et al. ............... 257/371

FOREIGN PATENT DOCUMENTS

JP 2002-094001 3/2002
TW 550781 9/2003

* cited by examiner

*Primary Examiner*—Evan Pert
*Assistant Examiner*—Kevin Quinto
(74) *Attorney, Agent, or Firm*—Morgan Lewis & Bockius LLP

(57) ABSTRACT

An ESD protection circuit using an N-type extended drain silicon controlled rectifier (N-EDSCR) and a method for fabricating the same are provided. An electro-static discharge (ESD) protection circuit includes a substrate, a well formed in the substrate, a drift region having a predetermined portion overlapped with the well, a plurality of first diffusion layers respectively formed in the well and the drift region, a plurality of second diffusion layers respectively formed in the well and the drift region, wherein corresponding first and second diffusion layers in the well are formed separately from each other and those in the drift region are formed adjacent to each other, a source region formed in a manner of surrounding a second conductive type diffusion layer inside the well, and a gate electrode formed on the well between the source and the drift region.

31 Claims, 14 Drawing Sheets

US 7,582,936 B2

ELECTRO-STATIC DISCHARGE PROTECTION CIRCUIT AND METHOD FOR FABRICATING THE SAME

FIELD OF THE INVENTION

The present invention relates to an electro-static discharge (ESD) protection circuit and a method for fabricating the same; and more particularly, to an ESD protection circuit using an N-type extended drain silicon controlled rectifier (N-EDSCR) and a method for fabricating the same.

DESCRIPTION OF RELATED ARTS

It is necessary to have a tolerance with respect to a serge voltage and a serge current caused by an electro-static discharge (ESD) given on an input/output pad of a semiconductor chip. So far as mentioned above, an ESD protection circuit is typically connected to the input/output pad of the semiconductor chip.

Typically, the ESD protection circuit should be satisfied with the following basic operation conditions. The basic operation conditions of the ESD protection circuit will be explained in detail with reference to FIG. 1.

First, in case that a normal operation voltage (Vop) is coupled to a semiconductor chip, i.e., a micro chip, the ESD protection circuit should not be operated. Accordingly, an avalanche breakdown voltage (Vav) and a triggering voltage (Vtr) of the ESD protection circuit are higher than the operation voltage (Vop) of the micro chip.

Secondly, in case that a voltage lower than an avalanche breakdown voltage (Vav) of the ESD protection circuit is coupled, a leakage current generated from the ESD protection circuit is minimized.

Thirdly, while the ESD protection circuit is operated, a gate oxide layer is not damaged. Accordingly, a triggering voltage (Vtr) and a thermal breakdown voltage (Vtb) are lower than a gate oxide breakdown voltage (Vgox).

Fourthly, the ESD protection circuit is not operated irregularly by a latch-up. Thus, the ESD protection circuit has a sufficient safety margin (ΔV). Also, a snapback holding voltage (Vh) of the ESD protection circuit is higher than an operation voltage (Vop) of a micro chip or a triggering current (Itr) of the ESD protection circuit is sufficiently high.

Fifthly, the ESD protection circuit is designed to have a sufficient tolerance with respect to an ESD stress current. Accordingly, before a thermal breakdown happens, a sufficiently large amount of the ESD stress current is passed.

Lastly, in case that the ESD protection circuit is formed in a multi-finger structure, each finger is uniformly operated. That is, as for the multi-finger structure, triggering is generated at a certain finger and thus, triggering is also generated at other fingers before heat breakdown happens. Accordingly, a thermal breakdown voltage is higher than a triggering voltage or at least equal to the triggering voltage.

One of the ESD protection circuits to be designed based on the above described operation conditions is illustrated in FIG. 2.

FIG. 2 is a cross-sectional view illustrating a conventional N-type extended drain silicon controlled rectifier (N-EDSCR) device. The conventional N-EDSCR device is an ESD protection circuit applied to a micro chip operating in a high voltage.

As shown in FIG. 2, as for the N-EDSCR device, a P-type well 11 is formed in a P-type substrate 10. An N⁻-type drift region 17 is formed inside the P-type well 11. A P⁺-type diffusion region 13 for a cathode electrode and an N⁺-type diffusion region 15 for a cathode electrode are formed inside the P-type well 11 and the P⁺-type diffusion region 13 and the N⁺-type diffusion region 15 are formed apart from the N⁻-type drift region 17 in a predecided distance. Also, a P⁺-type diffusion region 14 for an anode electrode and an N⁺-type diffusion region 16 for an anode electrode are formed inside the N⁻-type drift region 17.

A gate electrode 18 is formed on the P-type well 11 between the N⁺-type diffusion region 15 and the N⁻-type drift region 17. At this time, the N⁺-type diffusion region 15 is placed adjacent to the gate electrode 18. The N⁻-type drift region 17 is formed adjacent to the gate electrode 18 or a predetermined portion of the N⁻-type drift region 17 is overlapped with a predetermined portion of the gate electrode 18.

A plurality of device isolation layers 12 are formed between the P⁺-type diffusion region 13 and the N⁺-type diffusion region 15, between the P⁺-type diffusion region 14 and the P-type well 11, and between the P⁺-type diffusion region 13 and the substrate 10, respectively to electrically isolate the above listed constitution elements from each other through a shallow trench isolation (STI) process. Furthermore, a plurality of diffusion barrier layers 19 are formed beneath the device isolation layers 12 between the N⁻-type drift region 17 and the P-type well 11 and between the P⁺-type diffusion region 13 and the N⁺-type diffusion region 15.

The P⁺-type diffusion region 13, the N⁺-type diffusion region 15 and the gate electrode 18 are electrically connected, thereby forming a cathode electrode 20. The N⁺-type diffusion region 16 and the P⁺-type diffusion region 14 are connected with each other, thereby forming an anode electrode 21.

An operation property of the N-EDSCR device having the above constitution is explained hereinafter. In case that an ESD stress is coupled to the cathode electrode 20 in a ground voltage and the ESD stress is coupled to the anode electrode 21 in a positive voltage, a silicon controlled rectifier (SCR) formed by combining a lateral NPN bipolar junction transistor (BJT) and a vertical PNP BJT with each other is operated. Thus, the ESD stress is reduced.

At this time, an avalanche breakdown voltage of the lateral NPN BJT is determined by a lateral avalanche breakdown voltage of the N⁻-type drift region 17 and that of the P-type well 11. An avalanche breakdown voltage of the vertical PNP BJT is determined by a vertical avalanche breakdown voltage of the N⁻-type drift region 17 and that of the P-type well 11. Typically, the lateral avalanche breakdown voltage is lower than the vertical avalanche breakdown voltage. Accordingly, an avalanche breakdown voltage of the N-EDSCR device is determined by the lateral avalanche breakdown voltage of the N⁻-type drift region 17 and that of the P-type well 11.

Generally, as a distance S between an edge of the N-type drift region 17 adjacent to the gate electrode 18 and an edge of the N⁺-type diffusion region 16 gets reduced, the avalanche breakdown voltage and a triggering voltage of the N-EDSCR device are also decreased. However, in case that the distance S is excessively decreased, a leakage current may be increased when a voltage lower than the avalanche breakdown voltage is coupled.

Meanwhile, in case that the ESD stress is coupled to the cathode electrode 20 in a positive voltage and the ESD stress is coupled to the anode electrode 21 in a ground voltage, the P-type well 11 and the N⁻-type drift region 17 are operated as a forward biased diode.

FIGS. 3 and 4 are graphs exhibiting a simulation result of a current-voltage property in a state to which an ESD stress is coupled to the N-EDSCR device shown in FIG. 2. At this time, the ESD stress is coupled to the cathode electrode 20 in a ground voltage and the ESD stress is coupled to the anode electrode 21 in a positive voltage.

As shown in FIGS. 3 and 4, as for the N-EDSCR device, at the point which an avalanche breakdown voltage and a triggering voltage are generated, a parasitic NPN BJP operates. Thus, most current is concentrated on a surface. Accordingly, a main current path has a high on-state resistance and thus, a predetermined voltage is applied between the cathode electrode 20 and the anode electrode 21 (Refer to a reference denotation A shown in FIGS. 3 and 4).

However, the current flowed into the N-EDSCR device is increased, a parasitic PNP BJT is operated. Thus, this current is flowed not only into a surface of the device but also into a depth direction of the device. As mentioned above, if the current is flowed widely into the depth direction of the device, the main path current still has a very low on-state resistance. Accordingly, a very low voltage is applied between the cathode electrode 20 and the anode electrode 21 (refer to a reference denotation B in FIGS. 3 and 4).

However, although the current flowed into the N-EDSCR device is increased, the current dispersed into the depth direction of the device and the low operation resistance are maintained. Thus, until the point where the heat breakdown is generated in the device, a very low voltage is applied between the cathode electrode 20 and the anode electrode 21 (refer to a reference denotation C shown in FIGS. 3 and 4).

Meanwhile, due to the current-voltage property obtained through the simulation, a snapback holding voltage gets lower than an operation voltage and a thermal breakdown voltage is lower than a triggering voltage. Accordingly, as for the conventional N-EDSCR device, since a snapback holding voltage is lower that a triggering voltage, the N-EDSCR device is exposed to a latch-up. Also, since a heat breakdown avalanche breakdown voltage is lower than a triggering voltage, in case of forming a multi-finger structure, each finger cannot be stably operated. Accordingly, it is impossible to apply the N-EDSCR device to the ESD protection circuit.

SUMMARY OF THE INVENTION

It is, therefore, an object of the present invention to provide an electro-static discharge (ESD) protection circuit capable of settling a limitation resulted from a latch-up to a stable ESD protection circuit by using a N-type extended drain silicon controlled rectifier (N-EDSCR) device, and a method for fabricating the same.

It is another object of the present invention to provide an ESD protection circuit capable of settling a limitation which each finger is not stably operated in case that a multi finger structure is formed by using a N-EDSCR structure, and a method for fabricating the same.

In accordance with one aspect of the present invention, there is provided an electro-static discharge (ESD) protection circuit, including: a substrate; a well formed in the substrate; a drift region having a predetermined portion overlapped with the well; a plurality of first diffusion layers respectively formed in the well and the drift region; a plurality of second diffusion layers respectively formed in the well and the drift region, wherein corresponding first and second diffusion layers in the well are formed separately from each other and those in the drift region are formed adjacent to each other; a source region formed in a manner of surrounding a second conductive type diffusion layer inside the well; and a gate electrode formed on the well between the source and the drift region.

In accordance with another aspect of the present invention, there is provided an ESD protection circuit, including: a substrate; a well formed in the substrate; a drift region formed inside the well; a plurality of first diffusion layers respectively formed in the well and the drift region; a plurality of second diffusion layers respectively formed in the well and the drift region, wherein corresponding first and second diffusion layers in the well are formed separately from each other and those in the drift region are formed adjacent to each other; a source region formed in a manner of surrounding a second diffusion layer inside the conductive type well; and a gate electrode formed on the well between the source region and the drift region.

In accordance with further aspect of the present invention, there is provided a method for fabricating an ESD protection circuit, including: providing a substrate in which a well, a device isolation layer and a diffusion barrier region are formed; forming a source region contacted with one sidewall of the diffusion barrier region and that of the device isolation layer; forming a drift region having a predetermined portion overlapped with the well; forming a gate electrode on the well between the source region and the drift region; forming two first diffusion layers inside the well and the drift region respectively; and forming two second conductive type diffusion layers respectively formed in the well and the drift region, wherein each of the second diffusion layers in the well is formed separately from a corresponding one of the first diffusion layers in the well through the device isolation layer and each of the second diffusion layers is formed adjacent to a corresponding one of the first diffusion layers in the drift region.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on a preferred embodiment of the present invention will be provided with reference to the accompanying drawings.

Figure 5:
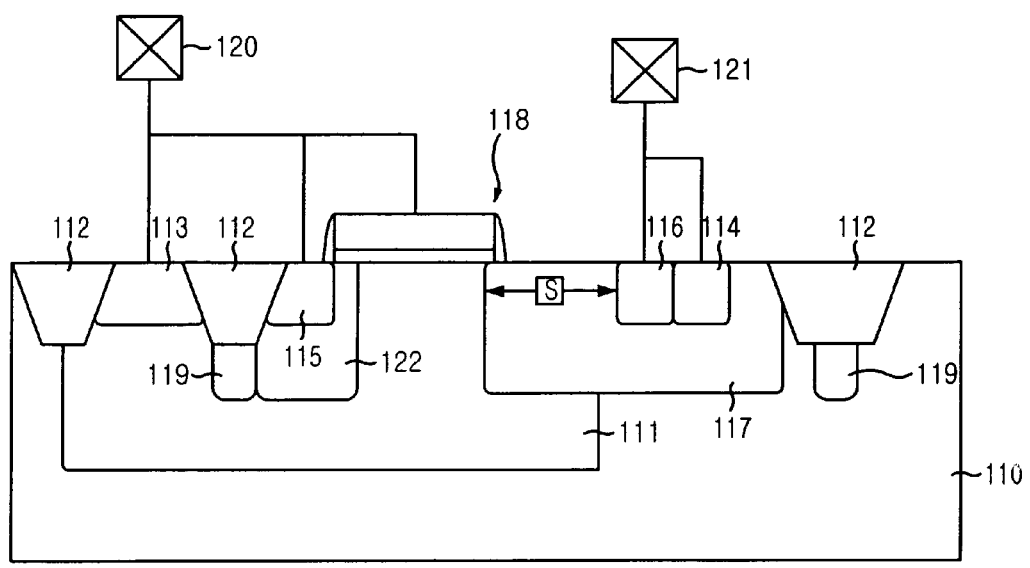
FIG. 5 is a cross-sectional view illustrating an N-type extended drain silicon controlled rectifier_counter pocket source (N-EDSCR_CPS) device in accordance with a first embodiment of the present invention.

FIG. 5 is a cross-sectional view illustrating an electro-static discharge (ESD) protection circuit in accordance with a first embodiment of the present invention.

As shown in FIG. 5, for the ESD protection circuit in accordance with the first embodiment of the present invention, a P-type well region 111 is reduced compared to an N-type extended drain silicon controlled rectifier (N-EDSCR) structure. Accordingly, a portion or the whole of a $N^-$-type drift region 117, an $N^+$-type diffusion region 116 for an anode electrode and a $P^+$-type diffusion region 114 for an anode electrode existing inside the N-type drift region 117 are exposed to a substrate 110.

The P-type well region 111 includes a $P^+$-type diffusion region 113 for a cathode electrode and an $N^+$-type diffusion region 115 for a cathode electrode. Furthermore, the P-type well region 111 may include a predetermined portion of the $N^-$-type drift region 117 to be overlapped with the predetermined portion of the $N^-$-type drift region 117. Also, the P-type well region 111 can be formed in a structure in which a predetermined portion of the P-type well region 111 is contacted with a predetermined portion of the $N^-$-type drift region 117.

A P-type counter pocket source implantation process which is an opposite type of the $N^+$-type diffusion region 116 is performed, thereby forming a counter pocket source region 122. The counter pocket source region 122 is formed in a manner to surround the $N^+$-type diffusion region 115 and is separated from the $N^-$-type diffusion region 117 in a predecided distance. It is preferable that an implantation dose of the counter pocket source region 112 is lower than that of the $N^+$-type diffusion region 115, i.e., the implantation dose ranging from approximately $10^{15}$ cm$^{-3}$ to approximately $10^{16}$ cm$^{-3}$, and higher than that of the $N^-$-type drift region 117, i.e., the implantation dose of approximately $10^{13}$ cm$^{-3}$.

A gate electrode 118 is formed on the P-type well region 111 between the $N^+$-type diffusion region 115 and the $N^-$-type drift region 117. At this time, the $N^+$-type diffusion region 115 is placed adjacent to the gate electrode 118. The $N^-$-type drift region 117 is formed adjacent to the gate electrode 118, or a predetermined portion of the $N^-$-type drift region 117 is overlapped with the gate electrode 118.

A plurality of device isolation layers 112 are formed through a shallow trench isolation (STI) process between the $P^+$-type diffusion region 113 and the $N^+$-type diffusion region 115 or the counter pocket source region 122, between a $P^+$-type diffusion layer 114 and the substrate 110, and between the P+-type diffusion region 113 and the substrate 110, respectively to electrically isolate the aforementioned constitution elements from each other. Furthermore, a plurality of diffusion barrier regions 119 are formed beneath the device isolation layers 112 formed between the $N^-$-type drift region 117 and the substrate 110, and between the $P^+$-type diffusion region 113 and the $N^+$-type diffusion region 115.

The $P^+$-type diffusion region 113, the $N^+$-type diffusion region 115 and the gate electrode 118 are electrically connected, thereby forming a cathode electrode 120. The $N^+$-type diffusion region 116 and the $P^+$-type diffusion region 114 are electrically connected with each other, thereby forming an anode electrode 121.

As for a N-type extended drain silicon controlled rectifier_counter pockets source (N-EDSCR_CPS) device having the above described constitution, in case that an ESD stress is coupled to the cathode electrode 120 in a ground voltage and the ESD stress is coupled to the anode electrode 121 in a positive voltage, a silicon controlled rectifier (SCR) in which a lateral NPN bipolar junction transistor (BJT) and a vertical PNP BJT are combined with each other operates. At this time, an avalanche breakdown voltage of the lateral NPN BJT is determined by a lateral breakdown voltage of the $N^-$-type drift region 117 and that of the P-type well region 111 (or the substrate 110). An avalanche breakdown voltage of the vertical PNP BJT is determined by a vertical breakdown voltage of the $N^-$-type drift region 117 and that of the P-type well region 111 (or the substrate 110). Herein, the lateral breakdown voltage is smaller than the vertical lateral breakdown voltage. Accordingly, an avalanche breakdown voltage of the N-EDSCR is determined by the lateral breakdown voltage of the $N^-$-type drift region 117 and the P-type well (or the substrate 110).

The N-EDSCR_CPS device in accordance with the first embodiment of the present invention shows a trend which a triggering voltage and a triggering current are increased together by the formation of the counter pocket source region 122 and the reduction in the P-type well region 111. In this structure, if a distance S between an edge of the $N^-$-type drift region 117 and an edge of the $N^+$-type diffusion region 116 is reduced, both the avalanche breakdown voltage and the triggering voltage can be greatly reduced. At this time, the triggering current is not greatly changed due to the reduced distance S. Accordingly, the increased triggering voltage by the formation of the counter pocket source region 122 can be controlled by changing the distance S. Furthermore, the counter pocket source region 122 provides an effect of reducing a leakage current. Accordingly, although the distance S is decreased, the leakage current is not increased. Thus, if the distance S is optimized in a state in which the P-type well 111 is partially formed and the counter pocket source region 122 is formed, the avalanche breakdown voltage, the triggering voltage and the triggering current can be independently controlled.

Meanwhile, in case that the ESD stress is coupled to the cathode electrode 120 in a positive voltage and the ESD stress is coupled to the anode electrode 121 in a ground voltage, the P-type well 111 (or the substrate 110) and the $N^-$-type drift region 117 are operated in a forward biased diode.

Figure 6:
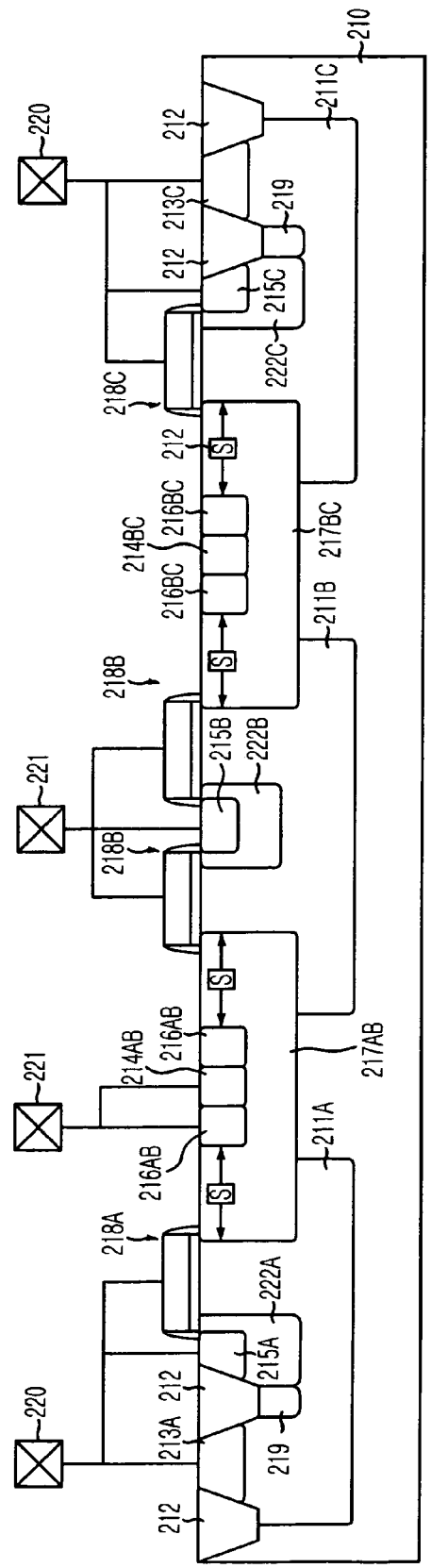
FIG. 6 is a cross-sectional view illustrating an ESD circuit having a multi-finger structure formed by using the N-EDSCR_CPS device shown in FIG. 5.

FIG. 6 is a cross-sectional view illustrating a multi-finger structure based on the N-EDSCR_CPS device shown in FIG. 5. As shown in FIG. 6, a region with connected to the cathode electrode 220 and a region with connected to the anode electrode 221 are repeatedly and symmetrically placed.

Referring to FIG. 6, as for the multi-finger structure, three P-type well regions 211A to 211C are formed inside a substrate 210. A $P^+$-type diffusion layer 213A for a cathode electrode and an $N^+$-type diffusion region 215A for a cathode electrode are formed inside the first P-type well 211A. Also, a counter pocket source region 222A is formed in a manner to surround the $N^+$-type diffusion layer 215A. A predetermined portion of an $N^-$-type drift region 217AB is overlapped with the first P-type well 211A and thus, the $N^-$-type drift region 217AB is separately formed from the $P^+$-type diffusion region 222A. In the $N^-$-type drift region 217AB, two $N^+$-type diffusion layers 216AB for an anode electrode and a $P^+$-type diffusion layer 214AB interposed between the two N+-type diffusion layers 216AB are formed. At this time, the N+-type diffusion layers 216AB are formed apart from both edges of the N−-type drift region 217AB as much as a predecided distance S.

A second P-type well region 211B includes a predetermined portion of the N−-type drift region 217AB adjacent to the second P-type well region 211B. In the second P-type well 211B, P+-type diffusion layer 215B for a cathode electrode is formed between the N−-type drift region 217AB and a neighboring N−-type drift region 217BC. A counter pocket source region 222B is formed in a manner to surround the P+-type diffusion layer 215B. Furthermore, two gate electrodes 218B are formed by the P+-type diffusion layer 215 between them on the second P-type well 211B. In the N−-type drift region 217BC shared by the second P-type well 211B and the third P-type well 211C, two N+-type diffusion layers 216BC for an anode electrode and a P+-type diffusion layer 214BC interposed between the two N+-type diffusion layers 216BC are formed.

In the third P-type well 211C, similar with the first P-type well region 211A, a P+-type diffusion layer 213C for a cathode electrode and an N+-type diffusion layer 215C for a cathode electrode are formed. Furthermore, a P+-type diffusion region 222C is formed in a manner to surround the N+-type diffusion layer 215C in the third P-type well 211C. The third P-type well region 211C may or may not include a predetermined portion of the N−-type drift region 217BC shared by the second P-type well region 211B. Also, a gate electrode 218C is formed on the third P-type well region 211C between the N−-type drift region 117BC and the counter pocket source region 222C.

As for the multi-finger structure having the above described constitution, in case that an ESD stress is coupled to a cathode electrode 220 in a ground voltage and the ESD stress is coupled to an anode electrode 221 in a positive voltage, the multi-finger structure is operated identically with the N-EDSCR_CPS described in the first embodiment of the present invention.

Figure 7:
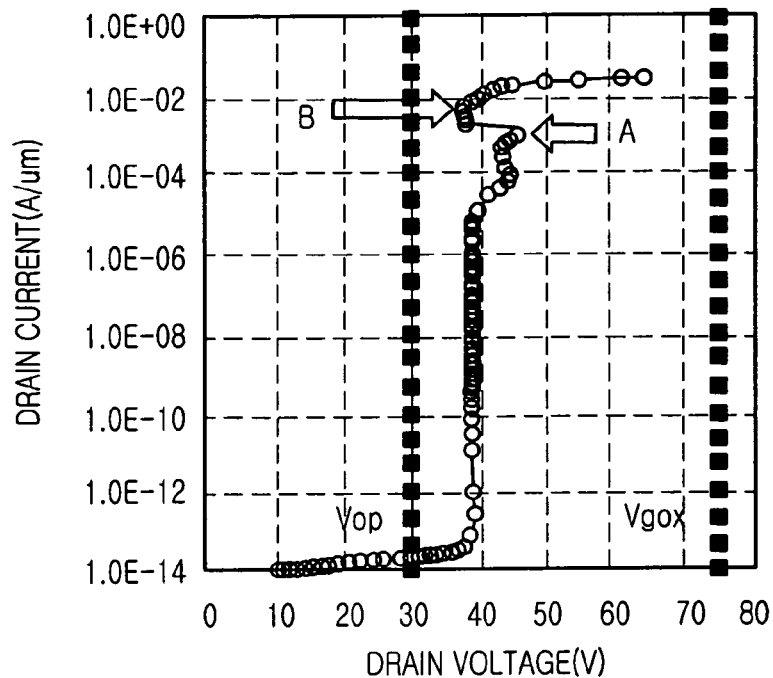
FIGS. 7 and 8 are graphs illustrating an operation property of the N-EDSCR_CPS device shown in FIG. 5.
Figure 8:
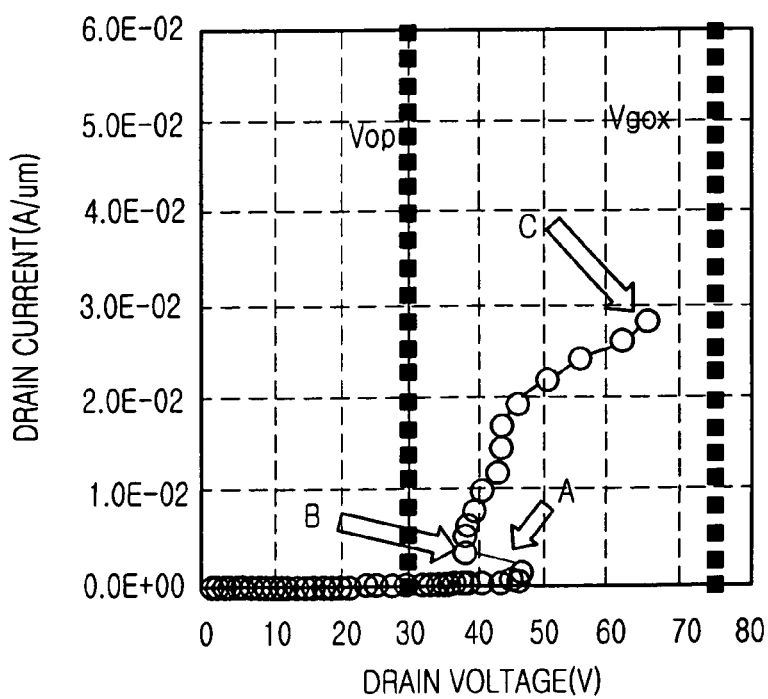

FIGS. 7 and 8 are graphs exhibiting a simulation result of a current-voltage property in a state to which an ESD stress is coupled to the N-EDSCR_CPS device shown in FIG. 5. At this time, an ESD stress is coupled to a cathode electrode in a ground voltage and to an anode electrode in a positive voltage.

Figure 2:
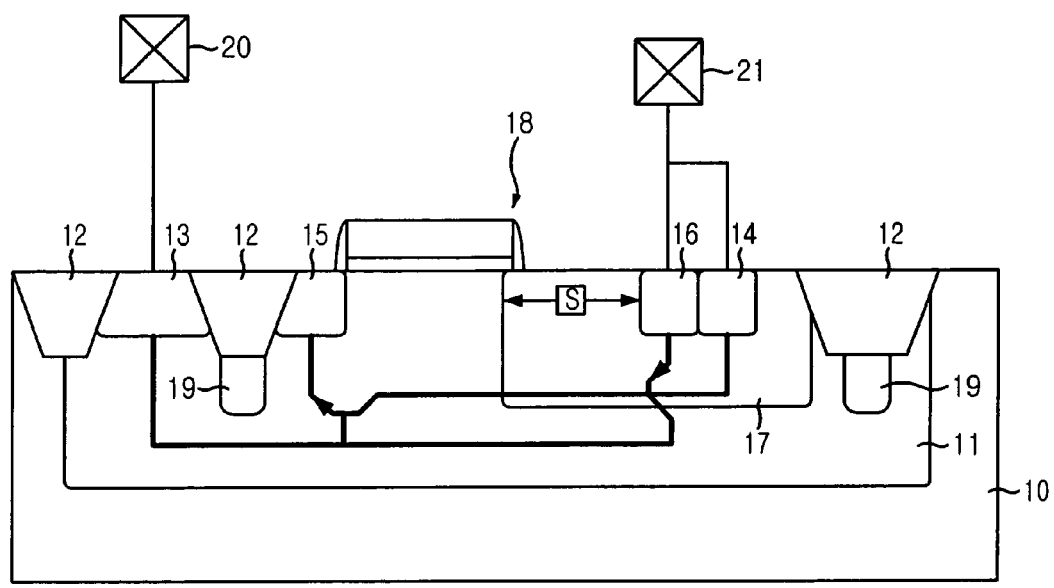
FIG. 2 is cross-sectional view illustrating a conventional N-type extended drain silicon controlled rectifier (N-EDSCR)
Figure 3:
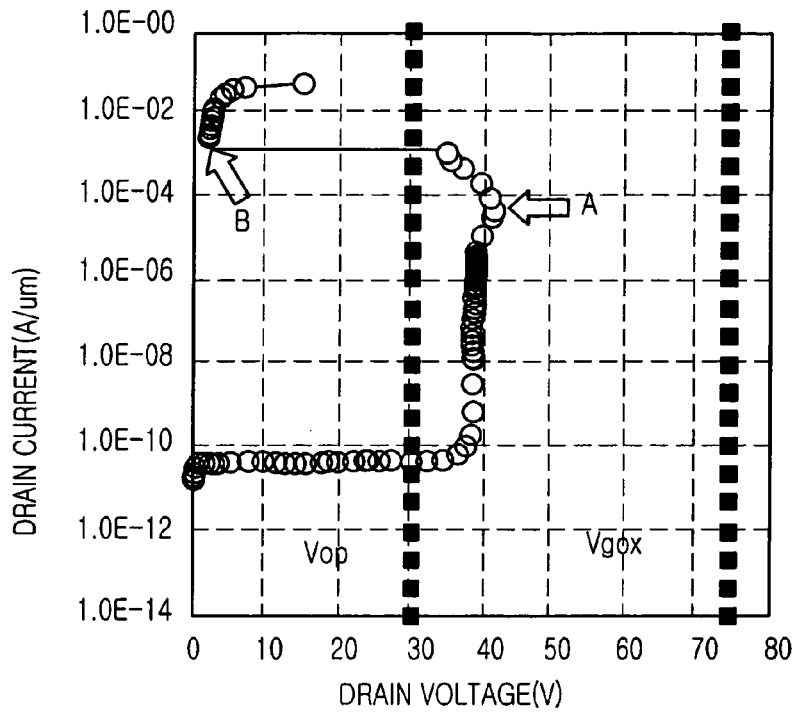
FIGS. 3 and 4 are graphs illustrating an operation property of the conventional N-EDSCR device shown in FIG. 2.
Figure 4:
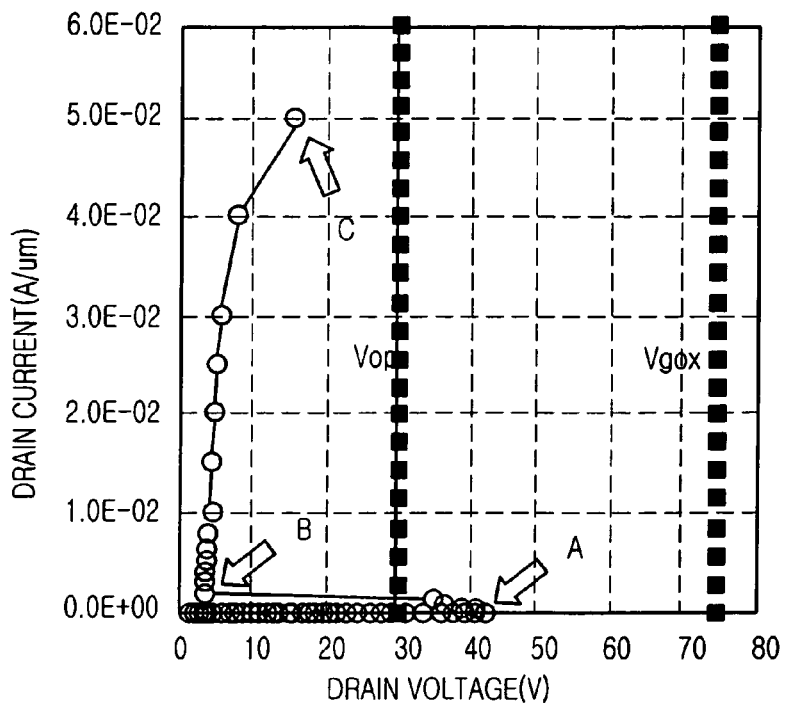

Referring FIGS. 7 and 8, as for the N-EDSCR_CPS device, in case that a voltage lower than an avalanche breakdown voltage due to the formation of the counter pocket source region 122 shown in FIG. 5 is coupled, a leakage current is reduced by approximately $10^{-4}$ fold compared with the conventional N-EDSCR device shown in FIG. 2.

In case of the N-EDSCR_CPS device, at the point which the avalanche breakdown voltage and the triggering voltage are generated, a parasitic NPN BJP operates similar with the conventional N-EDSCR device shown in FIG. 2. Thus, most current is concentrated on a surface. Accordingly, a main current path has a high on-state resistance and thus, a predetermined voltage is applied between the cathode electrode 120 and the anode electrode 121.

Meanwhile, a triggering current is increased in the N-EDSCR_CPS device due to influences of a structure in which the P-type well 111 includes a predetermined portion of the N−-type drift region 117, or a predetermined portion of the P-type well 111 is contacted with a predetermined portion of the N−-type drift region 117 (hereinafter, referred to as a partial P-type well structure), and a structure in which the counter pocket source region 122 is formed in a manner to surround the N+-type diffusion layer 115.

Referring to FIGS. 7 and 8, the triggering current per unit width of the N-EDSCR_CPS device is equal to or more than approximately 1 mA/μm. That is, if a whole width of the N-EDSCR_CPS device is equal to or more than approximately 100 μm, the triggering current is more than approximately 100 mA. Accordingly, in the N-EDSCR_CPS device, the triggering current is increased by increasing the whole width of the N-EDSCR_CPS device and thus, it is possible to embody a device free from a latch-up (refer to a reference denotation A in FIGS. 7 and 8).

Furthermore, as a current coupled to the N-EDSCR_CPS device is increased, the parasitic PNP BJT operates. This current is flowed not only into a surface of the device but also into a depth direction of the device. As mentioned above, although the current is flowed widely into the depth direction of the device, the main path current still has the high on-state resistance due to the influences of the partial P-type well structure and the counter pocket source region 122. Accordingly, a predetermined voltage is applied between the cathode electrode 120 and the anode electrode 121 (refer to a reference denotation B in FIGS. 7 and 8).

However, although the current flowed into the N-EDSCR_CPS device is eventually increased, the on-state resistance is not greatly changed. Thus, a voltage applied between the cathode electrode 120 and the anode electrode 121 is increased in proportionate to the current flowed between the cathode electrode 120 and the anode electrode 121 (refer to a reference denotation C in FIGS. 7 and 8).

Meanwhile, due to the current-voltage property obtained by the simulation, as the depth of the device is increased, the triggering current can be easily increased in the N-EDSCR_CPS device. Furthermore, a snapback holding voltage can be generated more highly than an operation voltage. Accordingly, it is possible to design an ESD protection circuit free from a latch-up similar with the N-EDSCR_CPS device described in the first embodiment of the present invention.

Figure 1:
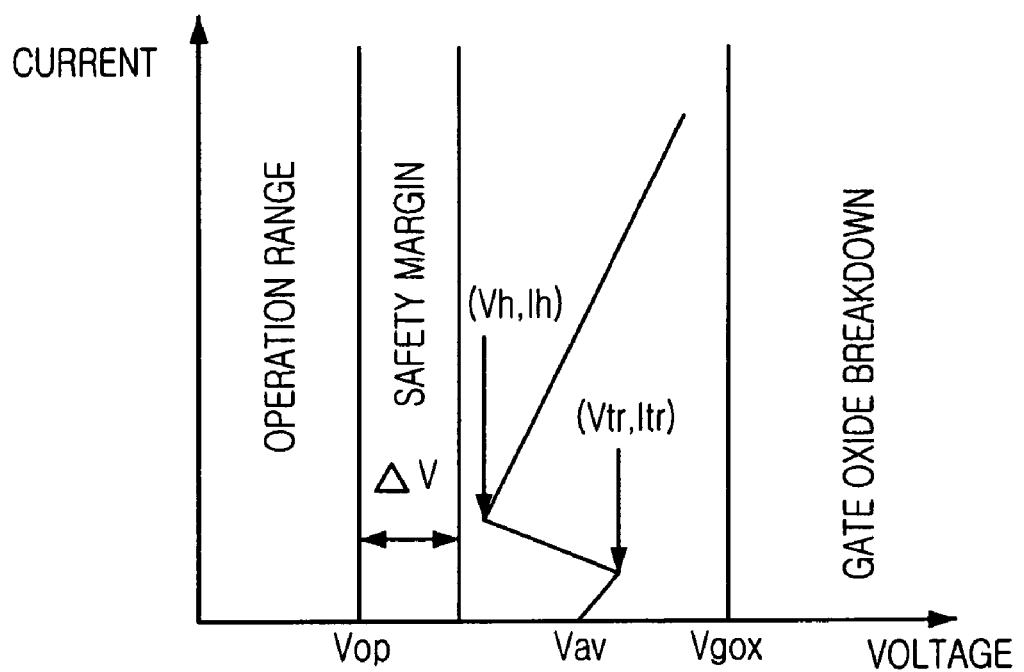
FIG. 1 is a diagram illustrating an operation property of a basic electro-static discharge (ESD) protection circuit.

However, a heat breakdown current of the N-EDSCR_CPS device is decreased compared to that of the conventional N-EDSCR device shown in FIG. 2. However, since the heat breakdown current of the N-EDSCR_CPS device is still high, the heat breakdown current can be used in the ESD protection circuit. Furthermore, a decrease in the heat breakdown current of the N-EDSCR_CPS device can be solved by increasing the number of fingers in the multi-finger structure. As described above, the heat breakdown current is decreased in the N-EDSCR_CPS device; however, the heat breakdown voltage of the N-EDSCR_CPS device can be generated more highly than the triggering voltage. In case that the multi-finger structure is formed by using the N-EDSCR_CPS device, each finger structure can be stably operated. Accordingly, the N-EDSCR_CPS device can obtain the current-voltage property corresponding to a basic operation condition of the ESD protection circuit shown in FIG. 1 and thus, it is possible to embody the stable ESD protection circuit.

Although the partial well structure and the counter pocket source region are formed in the N-EDSCR_CPS device in accordance with the first embodiment of the present invention, the N-EDSR_CPS device can be embodied only with the counter pocket source region without the partial P-type well structure.

Figure 9:
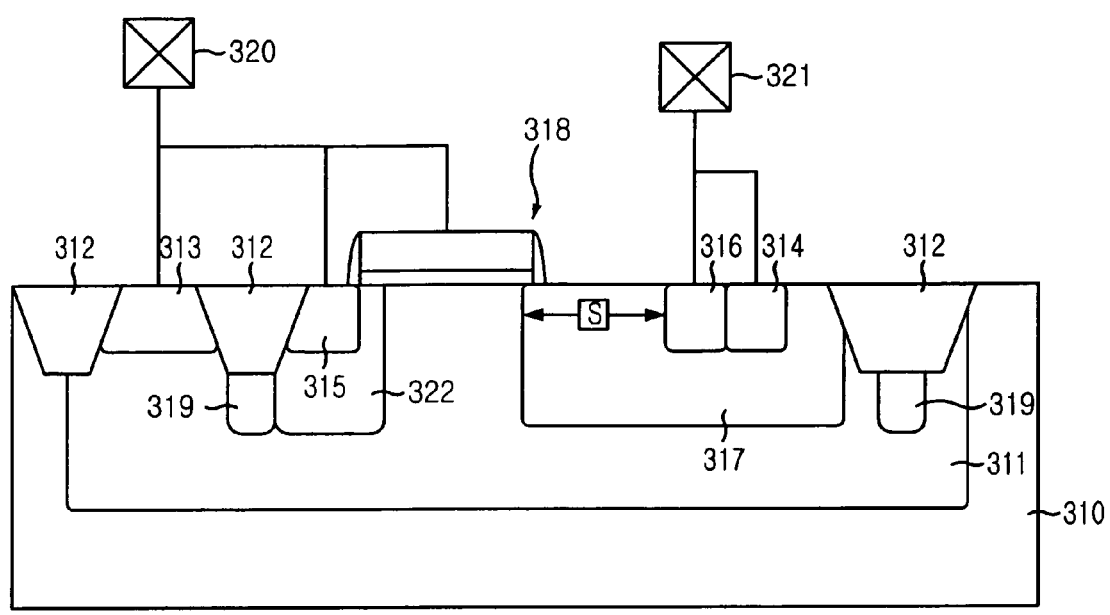
FIG. 9 is a cross-sectional view illustrating a modified embodiment of the N-EDSCR_CPS device shown in FIG. 5.

FIG. 9 is a cross-sectional view illustrating a modified embodiment of the N-EDSCR_CPS device shown in FIG. 5. Herein, the same reference denotations used in FIG. 5 are also used to denote the same constitution elements.

As shown in FIG. 9, in the N-EDSCR_CPS device, a P-type well region 311 is formed in a manner to surround a P+-type diffusion region 313 for a cathode electrode, an N+-type diffusion region 315 for a cathode electrode, and an N−-type drift region 317. Also, a counter pocket source region 322 is formed in a manner to surround the N+-type diffusion region 315. As described in FIGS. 7 and 8, it is possible to obtain an effect of more highly generating the snapback holding voltage than the operation voltage only with the formation of the counter pocket source region 322. That is, it is possible to embody the ESD protection circuit free from the latch-up.

Figure 10:
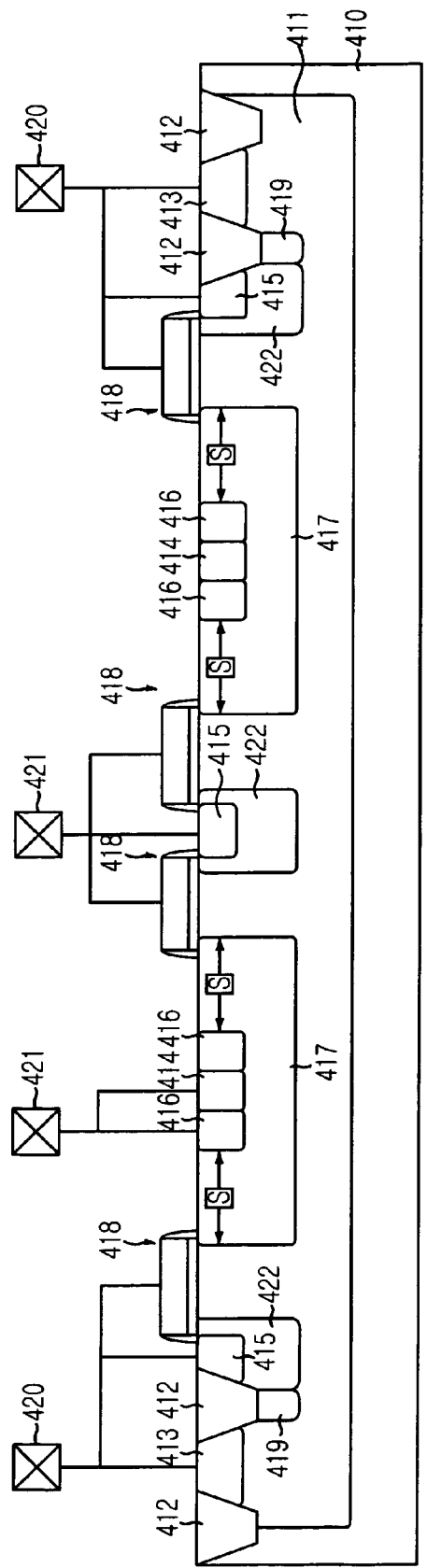
FIG. 10 is a cross-sectional view illustrating an ESD device having a multi-finger structure formed by using the N-EDSCR_CPS device shown in FIG. 9.

FIG. 10 is a cross-sectional view illustrating a multi-finger structure by using the modified N-EDSCR_CPS device shown in FIG. 9. Unlike the multi-finger structure shown in FIG. 6, each finger shares one P-type well 411. That is, the P-type well includes a plurality of P+-type diffusion layers 413 for a cathode electrode, a plurality of N+-type diffusion layers 415 for a cathode electrode, a plurality of N−-type drift regions 417, a plurality of N+-type diffusion layers 416 for an anode electrode, and a plurality of P+-type diffusion layers 414 for an anode electrode.

A method for fabricating the N-EDSCR_CPS device in accordance with the first embodiment of the present invention will be described hereinafter. The same reference numerals shown in FIG. 5 are also used herein to denote the same constitution elements.

Figure 11A:
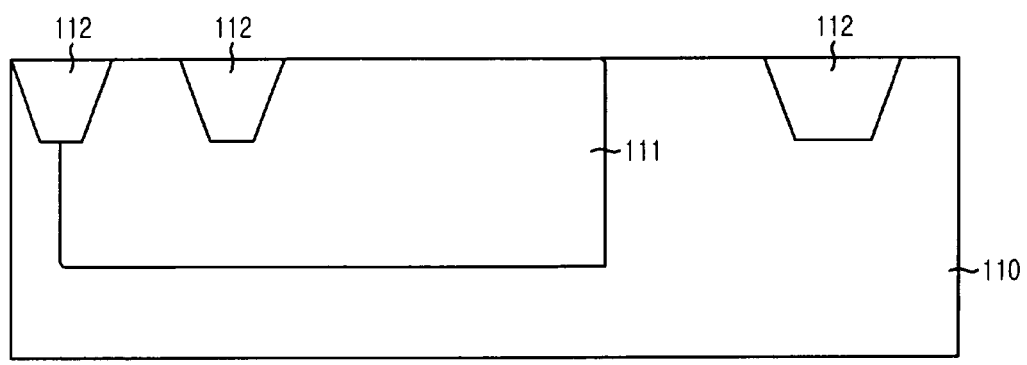
FIGS. 11A to 11E are cross-sectional views illustrating a method for fabricating the N-EDSCR_CPS device shown in FIG. 5.

Referring to FIG. 11A, a P-type implantation process is performed inside a P-type substrate 110, thereby forming a P-type well region 111. At this time, during performing the P-type implantation process, an implantation dose with a concentration equal to or less than approximately $10^{12}$ cm$^{-3}$ is used.

Subsequently, a STI process is employed and thus, a trench (not shown) is formed in a predetermined portion of the substrate 110. Then, the plurality of device isolation layers 112 are formed by using a high density plasma (HDP) oxide layers to fill the trenches.

Figure 11B:
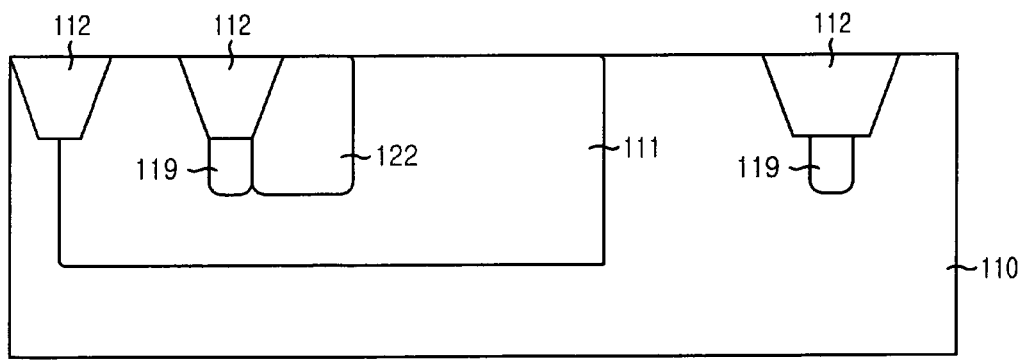

Subsequently, as shown in FIG. 11B, a plurality of diffusion barrier regions 119 are formed beneath the device isolation layers 112 corresponding to where the diffusion barrier regions 119 are supposed to be formed. At this time, the diffusion barrier regions 119 are N-type field stop regions. The diffusion barrier regions 119 are formed by using a dose with a concentration ranging from approximately $10^{12}$ cm$^{-3}$ to approximately $10^{13}$ cm$^{-3}$ through a P-type implantation process.

Subsequently, a P-type implantation process is performed, thereby forming a counter pocket source region 122. At this time, it is preferable that the P-type implantation process is employed by using a dose with a concentration ranging from approximately $10^{13}$ cm$^{-3}$ to approximately $10^{14}$ cm$^{-3}$.

Subsequently, although not shown, a P-type implantation process is performed, thereby forming a P-type drift region.

Meanwhile, although it is described that the counter pocket source region 122 is formed after the diffusion barrier regions 119 are formed, the counter pocket source region 122 can be formed before the diffusion barrier regions 119 are formed, as simultaneously as the diffusion barrier regions 119 are formed, or as simultaneously as the P-type drift is formed. Furthermore, during forming the diffusion barrier regions 119, a region in which the counter pocket source region 122 is formed is formed and afterwards, during forming the P-type drift region, the formation process of the counter pocket source region 122 is performed once more, thereby forming the counter pocket source region 122.

As described above, the formation process of the counter pocket source region 122 is performed in connection with the formation processes of the diffusion barrier regions 119 and the P-type drift region because a thermal condition necessary for the P-type implantation process performed for forming the counter pocket source region 112 is similar with that necessary for the formation processes of the diffusion barrier regions 119 and the P-type drift region. Accordingly, in the perspective of device efficiency, it is preferable that the formation process of the counter pocket source region 112 is performed in connection with the formation processes of the diffusion barrier region 119 and the P-type drift region.

Figure 11C:
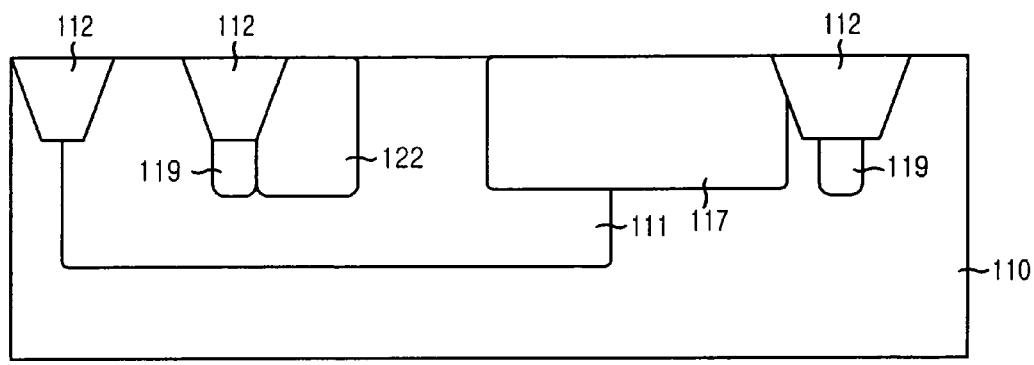

Subsequently, as shown in FIG. 11C, an N−-type implantation process is performed and thus, an N−-type drift region 117 is formed. At this time, a predetermined portion of the N−-type drift region 117 is included in the P-type well 111. At this time, the N-type implantation process is performed by using a dose with a concentration of approximately $10^{13}$ cm$^{-3}$.

Figure 11D:
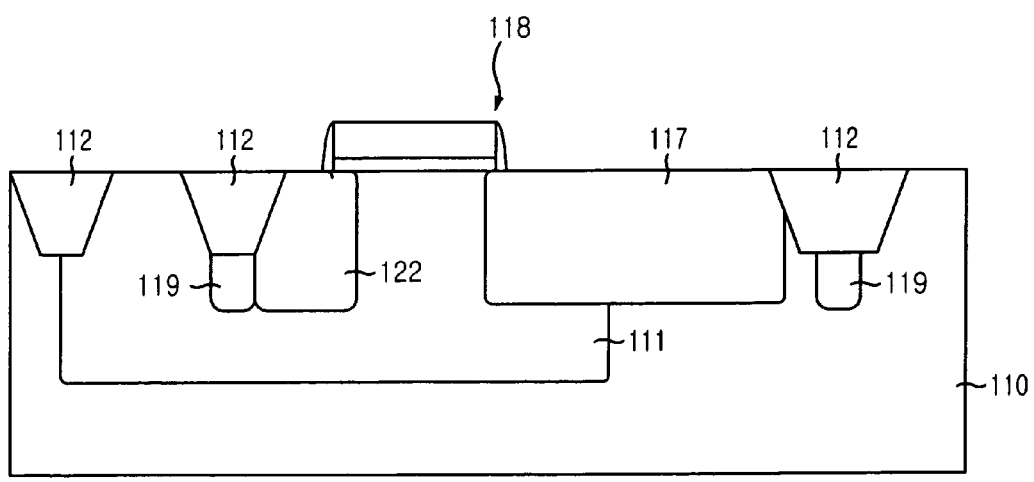

Subsequently, as shown in FIG. 11D, a gate electrode 118 is formed on the P-type well region 111 between the counter pocket source region 122 and the N−-type drift region 117. At this time, the gate electrode 118 is formed by using a gate insulation layer and a polysilicon layer. Spacers are formed on sidewalls of the gate electrode 118.

Figure 11E:
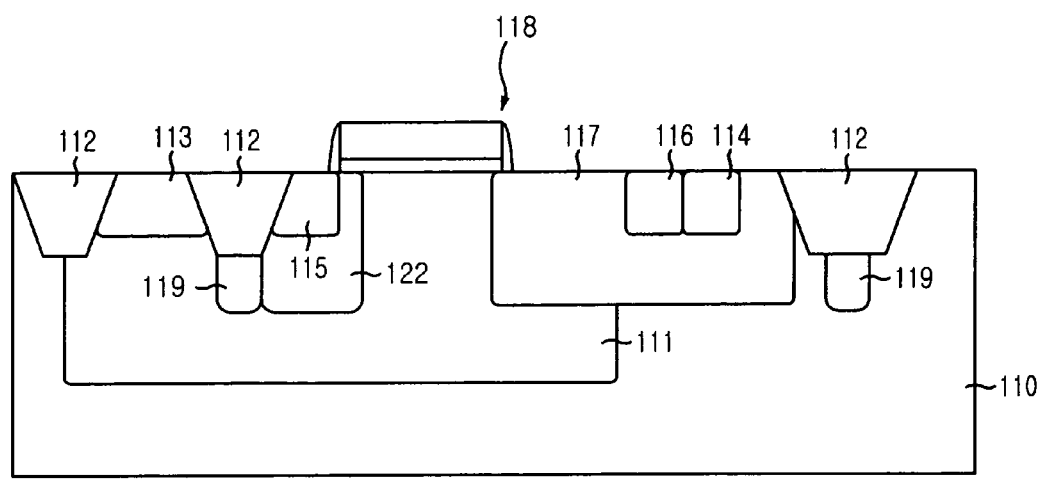

Subsequently, as shown in FIG. 11E, a P-type implantation process and an N-type implantation process are performed, thereby forming a P+-diffusion region 113 for a cathode electrode and an N+-type diffusion region 115 for a cathode electrode inside the P-type well region 111 and an N+-type diffusion region 116 for an anode electrode and a P+-type diffusion region 114 for an anode electrode inside the N−-type drift region 117. At this time, the P-type implantation process for forming the P+-type diffusion region 113 and the P+-type diffusion region 114 is performed by using a dose with a concentration ranging from approximately $10^{15}$ cm$^{-3}$ to approximately $10^{16}$ cm$^{-3}$ and the N-type implantation process for forming the N+-type diffusion region 115 and the N+-type diffusion region 116 is performed by using a dose with a concentration ranging from approximately $10^{15}$ cm$^{-3}$ to approximately $10^{16}$ cm$^{-3}$.

Figure 12:
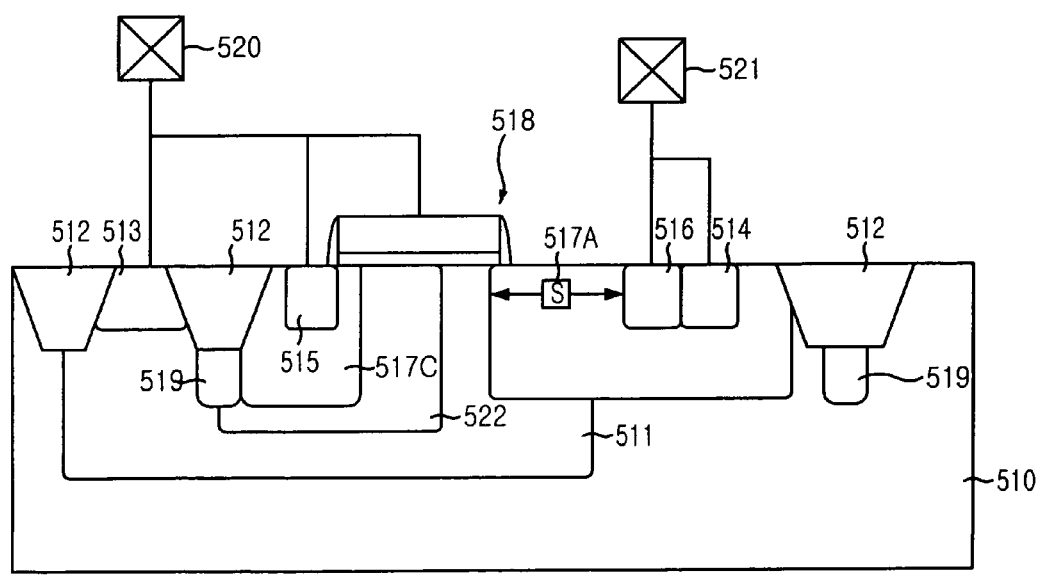
FIG. 12 is a cross-sectional view illustrating a bi-directional type N-type extended silicon controlled rectifier counter pocket source (N-EDSCR_CPS_Bi) device in accordance with a second embodiment of the present invention.

FIG. 12 is a cross-sectional view illustrating an ESD protection circuit in accordance with a second embodiment of the present invention. Herein, the ESD protection circuit in accordance with the second embodiment of the present invention illustrates a bi-directional type N-type extended drain silicon controlled rectifier device with a counter pocket source (N-EDSCR_CPS_Bi) as another embodiment of the N-EDSCR_CPS device.

As shown in FIG. 12, as for the ESD protection circuit in accordance with the second embodiment of the present invention, similar with the N-EDSCR_CPS device in accordance with the first embodiment of the present invention shown in FIG. 5, a P-type well region 511 is reduced, thereby forming a partial P-type well structure. Accordingly, a portion or the whole of a N−-type drift region 517A formed in an anode side, an N+-type diffusion region 516 for an anode electrode and a P+-type diffusion region 514 for an anode electrode existing inside the N-type drift region 517A are exposed to a substrate 510.

The P-type well region 511 includes a P+-type diffusion region 513 for a cathode electrode and an N+-type diffusion region 515 for a cathode electrode. Furthermore, the P-type well region 511 may include a predetermined portion of the N−-type drift region 517A to be overlapped with the predetermined portion of the N−-type drift region 517A. Also, the P-type well region 511 can be formed in a structure in which a predetermined portion of the P-type well region 511 is contacted with a predetermined portion of the N−-type drift region 517A. Also, an N−-type drift region is also formed in a cathode side and hereinafter, the N−-type drift region formed in the cathode side is referred to as a reference numeral 517C.

At this time, the N⁻-type drift region 517C is formed in a manner to surround the N⁺-type diffusion layer 515. Herein, the N⁺-type diffusion layer 515 is formed separately from one of a plurality of device isolation layer 512.

A P-type counter pocket source implantation process is performed, thereby forming a counter pocket source region 522 which is an opposite type to the N⁻-type drift regions 517A and 517C. At this time, the counter pocket source region 522 is formed in a manner to surround the N⁻-type drift region 517C and apart from the N⁻-type drift region 517A in a predecided distance. It is preferable that an implantation dose of the counter pocket source region 522 is lower than that of the N⁺-type diffusion layer 515, i.e., a dose with a concentration ranging from approximately $10^{15}$ cm⁻³ to approximately $10^{16}$ cm⁻³, and higher than that of the N⁻-type drift regions 517A and 517C, i.e., a dose with a concentration of approximately $10^{13}$ cm⁻³.

A gate electrode 518 is formed on the P-type well 511 between the N⁻-type drift region 217C and the N⁻-type drift region 517A. A plurality of device isolation layers 512 are formed between the P⁺-type diffusion layer 513 and the N⁻-type drift region 517C, between the N⁻-type drift region 517A and the substrate 510, and between P⁺-type diffusion layer 513 and the substrate 510 through a STI process. Furthermore, a plurality of diffusion barrier regions 519 are formed as a N-type field stop region beneath the device isolation layers 512 formed between the P⁺-type diffusion layer 513 and the N⁻-type drift region 517C, and between the N⁻-type drift region 517A and the substrate 510.

The P⁺-type diffusion layer 513, the N⁺-type diffusion layer 515, and the gate electrode 518 are electrically connected, thereby forming a cathode electrode 520. The N⁺-type diffusion layer 516 and the P⁺-type diffusion layer 514 are connected with each other, thereby forming an anode electrode 521.

Figure 13:
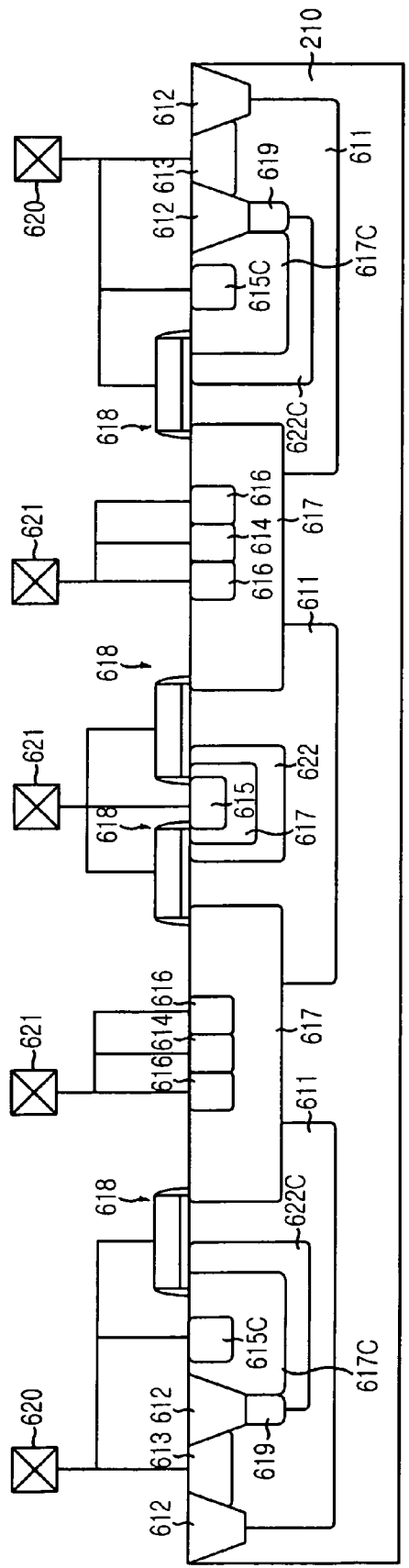
FIG. 13 is a cross-sectional view illustrating an ESD device having a multi-finger structure formed by using the N-EDSCR_CPS_Bi device shown in FIG. 12.

FIG. 13 is a cross-sectional view illustrating a multi-finger structure based on the N-EDSCR_CPS_Bi device shown in FIG. 12.

As shown in FIG. 13, a region to which the cathode electrode 620 is formed and a region to which the anode electrode 621 is formed are repeatedly and symmetrically. As for the multi-finger structure shown in FIG. 13, the N⁺-type diffusion layers 615C for cathode electrodes are placed inside the N⁻-type drift regions 617C formed inside the counter pocket source regions 622C as explained in FIG. 12 unlike the multi-finger structure formed by using the N-EDSCR_CPS device shown in FIG. 6. Other than this point, the multi-finger structure shown in FIG. 13 is similar with that shown in FIG. 6. Thus, a detailed operation property of the multi-finger structure based on the N-EDSCR_CPS_Bi is covered by that of the multi-finger structure shown in FIG. 6.

Figure 14:
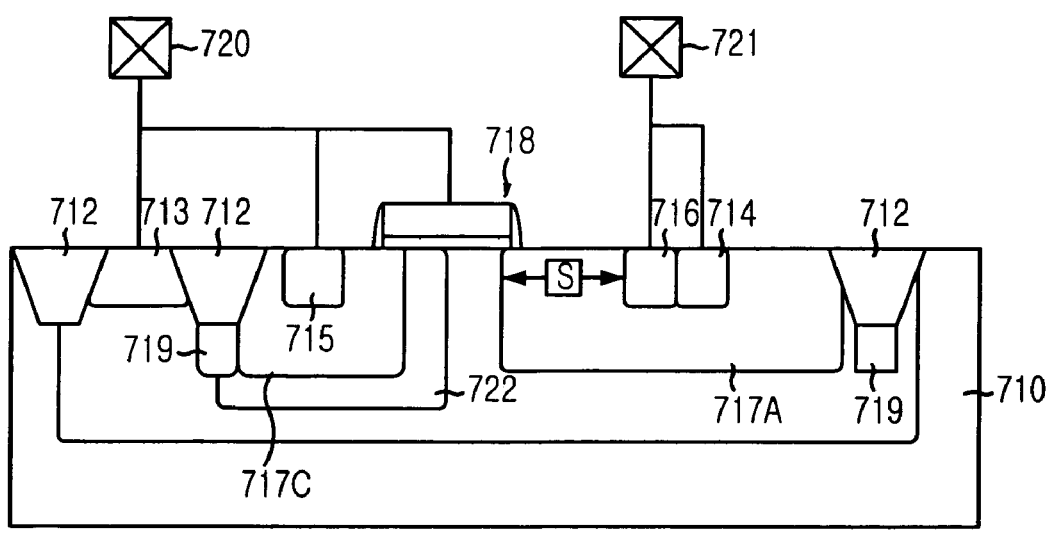
FIG. 14 is a cross-sectional view illustrating a modified embodiment of the N-EDSCR_CPS_Bi device shown in FIG. 12.

FIG. 14 is a cross-sectional view illustrating a modified embodiment of the N-EDSCR_CPS_Bi device shown in FIG. 12. As described above, although the structure in which the partial P-type well structure and the counter pocket source region 722 are formed is exemplified in accordance with the second embodiment of the present invention, the N-EDSCR_CPS_Bi device can be embodied with only the counter pocket source region 722 without the partial P-type well structure as shown in FIG. 14.

Figure 15:
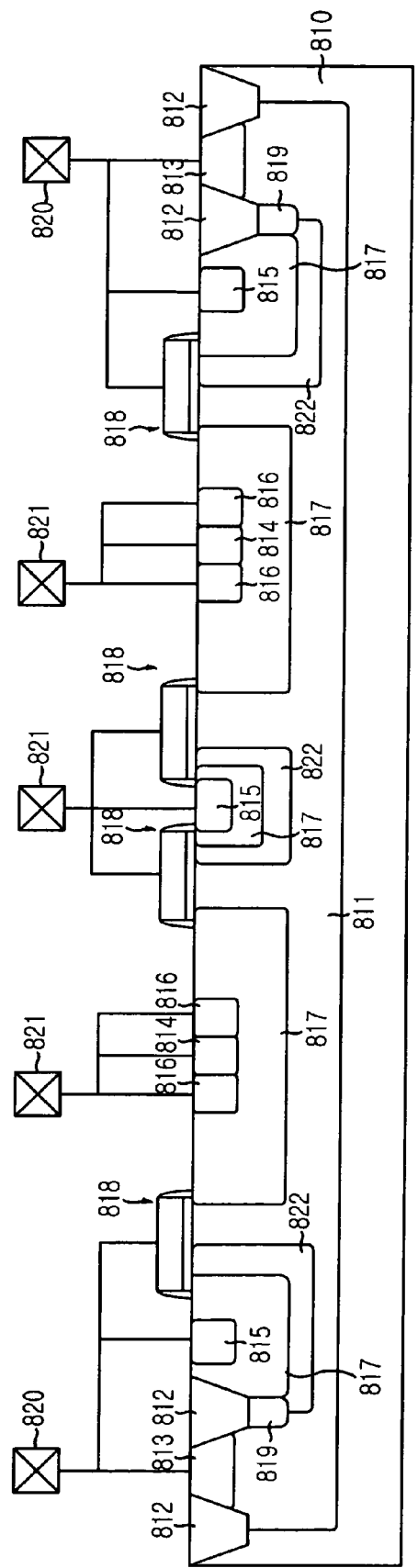
FIG. 15 is a cross-sectional view illustrating an ESD device having a multi-finger structure formed by using the N-EDSCR_CPS_Bi device shown in FIG. 14.

FIG. 15 is a cross-sectional view illustrating a multi-finger structure embodied by using the N-EDSCR_CPS_Bi device shown in FIG. 14.

As shown in FIG. 15, each finger structure shares one P-type well 811 unlike the multi-finger structure shown in FIG. 13. That is, the P-type well 811 includes a plurality of P⁺-type diffusion layer 813 for a cathode electrode, a plurality of N⁺-type diffusion layer 815 for a cathode electrode, a plurality of N⁻-type drift regions 817, a plurality of N⁺-type diffusion layer 816 for an anode electrode, and a plurality of P⁺-type diffusion layer for an anode electrode 814.

As described above, the following effects can be obtained in case of embodying the N-EDSCR_CPS device newly suggested in accordance with the embodiment of the present invention.

First, a triggering current can be easily increased by increasing a width of the N-EDSCR_CPS device. Furthermore, a snapback holding voltage can be generated more highly than an operation voltage. Accordingly, in case of using the N-EDSCR_CPS device, it is possible to embody an ESD protection circuit free from a latch-up.

Secondly, a heat breakdown voltage can be generated more highly than a triggering voltage in the N-EDSCR_CPS device. Accordingly, in case of embodying a multi-finger structure with the N-EDSCR_CPS device, each finger can be stably operated.

Accordingly, in case of embodying the ESD protection circuit by using the N-EDSCR_CPS device, a microchip can be stably protected from an electrostatic discharge. Furthermore, it is possible to reduce a size of the microchip, thereby improving compatibility of products.

The present application contains subject matter related to the Korean patent application No. KR 2004-0115911, filed in the Korean Patent Office on Dec. 30, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An electro-static discharge (ESD) protection circuit, comprising:
   a substrate;
   a well formed in the substrate;
   a drift region having a predetermined portion overlapped with the well;
   a plurality of first diffusion layers respectively formed in the well and the drift region;
   a plurality of second diffusion layers respectively formed in the well and the drift region, wherein corresponding first and second diffusion layers in the well are formed separately from each other and those in the drift region are formed adjacent to each other;
   a source region formed in a manner of surrounding a second diffusion layer inside the well; and
   a gate electrode formed on the well between the source and the drift region.

2. The ESD protection circuit of the claim 1, wherein the first and the second diffusion layers formed in the well and the gate electrode are connected to a first electrode, the first and the second diffusion layers in the drift region are connected to a second electrode, and an ESD stress is coupled to the first and the second electrodes.

3. The ESD protection circuit of the claim 1, wherein the source region has a different conductive type from the second diffusion layer in the well.

4. The ESD protection circuit of the claim 1, wherein a dose concentration of the source region is lower than the second diffusion layer inside the well and higher than the drift region.

5. The ESD protection circuit of claim 1, wherein the second diffusion layer inside the drift region is formed at a predetermined distance from one edge of the drift region adjacent to the gate electrode.

6. The ESD protection circuit of the claim 2, wherein in case that the ESD stress of a positive voltage is coupled to the first electrode and the ESD stress of a ground voltage is coupled to the second electrode, one of the well and the substrate, and the drift region operate as a forward biased diode.

7. The ESD protection circuit of the claim 1, wherein a first and a second transistor are coupled with each other to form a silicon controlled rectifier (SCR), the first transistor being formed with the second diffusion layer inside the well, the source region, the well, the drift region and the second diffusion layer inside the drift region, and the second transistor being formed with the first diffusion layer inside the well, the well, the drift region and the first diffusion layer inside the drift region.

8. The ESD protection circuit of the claim 7, wherein the SCR operates in case that a ground voltage is coupled to a first electrode to which the first and the second diffusion layers inside the well and the gate electrode are connected, and a positive voltage is coupled to a second electrode to which the first and the second diffusion layers inside the drift region are connected.

9. The ESD protection circuit of the claim 1, further comprising another drift region formed between the second diffusion layer and the source region inside the well in a manner of surrounding said second diffusion layer.

10. The ESD protection circuit of the claim 1, further comprising a device isolation layer disposed between the first and the second diffusion layers inside the well to isolate the first and the second diffusion layers from each other inside the well.

11. The ESD protection circuit of the claim 10, further including a diffusion barrier region formed beneath the device isolation layer.

12. The ESD protection circuit of the claim 11, wherein the source region and the diffusion barrier region are formed simultaneously.

13. An ESD protection circuit, comprising:
a substrate;
a well formed in the substrate;
a drift region formed inside the well;
a plurality of first diffusion layers respectively formed in the well and the drift region;
a plurality of second diffusion layers respectively formed in the well and the drift region, wherein corresponding first and second diffusion layers in the well are formed separately from each other and those in the drift region are formed adjacent to each other;
a source region formed in a manner of surrounding a second diffusion layer inside the well; and
a gate electrode formed on the well between the source region and the drift region.

14. The ESD protection circuit of the claim 13, wherein the first and the second diffusion layers formed in the well and the gate electrode are connected to a first electrode, the first and the second diffusion layers in the drift region are connected to a second electrode, and an ESD stress is coupled to the first and the second electrodes.

15. The ESD protection circuit of the claim 13, wherein the source region has a different conductive type from the second diffusion layer in the well.

16. The ESD protection circuit of the claim 13, wherein a dose concentration of the source region is lower than the second diffusion layer inside the well and higher than the drift region.

17. The ESD protection circuit of claim 13, wherein the second diffusion layer inside the drift region is formed at a predetermined distance from one edge of the drift region adjacent to the gate electrode.

18. The ESD protection circuit of the claim 14, wherein in case that the ESD stress of a positive voltage is coupled to the first electrode and the ESD stress of a ground voltage is coupled to the second electrode, one of the well and the substrate, and the drift region operate as a forward biased diode.

19. The ESD protection circuit of the claim 13, wherein a first and a second transistor are coupled with each other to form a silicon controlled rectifier (SCR), the first transistor being formed with the second diffusion layer inside the well, the source region, the well, the drift region and the second diffusion layer inside the drift region, and the second transistor being formed with the first diffusion layer inside the well, the well, the drift region and the first diffusion layer inside the drift region.

20. The ESD protection circuit of the claim 19, wherein the SCR operates in case that a ground voltage is coupled to a first electrode to which the first and the second diffusion layers inside the well and the gate electrode are connected, and a positive voltage is coupled to a second electrode to which the first and the second diffusion layers inside the drift region are connected.

21. The ESD protection circuit of the claim 13, further comprising a device isolation layer disposed between the first and the second diffusion layers inside the well to isolate the first and the second diffusion layers from each other inside the well.

22. The ESD protection circuit of the claim 21, further including a diffusion barrier region formed beneath the device isolation layer.

23. The ESD protection circuit of the claim 22, wherein the source region and the diffusion barrier region are formed simultaneously.

24. A method for fabricating an ESD protection circuit, comprising:
providing a substrate in which a well, a device isolation layer and a diffusion barrier region are formed;
forming a source region contacted with one sidewall of the diffusion barrier region and that of the device isolation layer;
forming a drift region having a predetermined portion overlapped with the well;
forming a gate electrode on the well between the source region and the drift region;
forming two first diffusion layers inside the well and the drift region respectively; and
forming two second diffusion layers respectively formed in the well and the drift region, wherein each of the second diffusion layers in the well is formed separately from a corresponding one of the first diffusion layers in the well through the device isolation layer and each of the second diffusion layers is formed adjacent to a corresponding one of the first diffusion layers in the drift region.

25. The method of claim 24, wherein the source region is formed through an implantation process performed within the same temperature as an implantation process of forming the diffusion barrier region.

26. The method of claim 25, wherein a dose concentration of the source region is lower than that of the second diffusion layer inside the well and higher than that of the drift region.

27. The ESD protection circuit of the claim 13, further comprising another drift region formed between the second diffusion layer and the source region inside the well in a manner of surrounding said second diffusion layer.

28. The ESD protection circuit of the claim 11, wherein the source region is formed before the diffusion barrier region is formed.

29. The ESD protection circuit of the claim 11, wherein the source region is formed after the diffusion barrier region is formed.

30. The ESD protection circuit of the claim 22, wherein the source region is formed before the diffusion barrier region is formed.

31. The ESD protection circuit of the claim 22, wherein the source region is formed after the diffusion barrier region is formed.

* * * * *